United States Patent
Kranzdorf et al.

(10) Patent No.: US 6,554,698 B2
(45) Date of Patent: Apr. 29, 2003

(54) FAN ONE WAY AIR VALVE

(75) Inventors: Sorin Kranzdorf, Pittsburgh, PA (US); Lan Tang, Wexford, PA (US)

(73) Assignee: Marconi Communications, Inc., Warrendale, PA (US)

( * ) Notice: Subject to any disclaimer, the term of this patent is extended or adjusted under 35 U.S.C. 154(b) by 0 days.

(21) Appl. No.: 09/730,211

(22) Filed: Dec. 5, 2000

(65) Prior Publication Data

US 2002/0068523 A1 Jun. 6, 2002

(51) Int. Cl.[7] .................................................. H05K 5/00
(52) U.S. Cl. ........................ 454/184; 454/353; 137/849
(58) Field of Search ................................. 454/187, 353, 454/184; 361/695; 137/849, 845, 512.15

(56) References Cited

U.S. PATENT DOCUMENTS 5,890,959 A * 4/1999 Pettit et al. .................. 454/184
6,031,717 A * 2/2000 Baddour et al. ............. 361/687
6,135,875 A * 10/2000 French ........................ 454/184

* cited by examiner

*Primary Examiner*—Jiping Lu
(74) *Attorney, Agent, or Firm*—Angel M. Schwartz

(57) ABSTRACT

A valve for a vent. The valve includes an inner leaf having a closed state which covers the vent and blocks gas flow through the vent in a first direction, and an open state which opens the vent and allows gas flow through the vent in a second direction. The valve includes an outer leaf opposing the inner leaf. A method for controlling gas flow through a vent. The method includes the steps of moving an inner leaf and an outer leaf opposing the inner leaf on the vent from a closed state which covers the vent and blocks gas flow through the vent in a first direction to an open state which opens the vent and allows gas flow through the vent in a second direction with gas flow moving in the second direction through the vent. Then there is the step of stopping the gas flow in the second direction allowing the inner leaf and the outer leaf to each move to the closed state.

20 Claims, 1 Drawing Sheet

FAN ONE WAY AIR VALVE

FIELD OF THE INVENTION

The present invention is related to a valve for a vent. More specifically, the present invention is related to a valve for a vent that can open 100% which has an inner leaf and an outer leaf opposing the inner leaf.

BACKGROUND OF THE INVENTION

Prior art fan air valves have restricted airflow since they open less than essentially 100%. The present invention controls the airflow when multiple fans work in parallel in a vented enclosure when one or more fans stop functioning. It prevents the pressurized airflow, pumped by the remaining fans, from leaking to the lower pressure inlet end of fans. It has a nonrestrictive airflow (it opens 100% ) and takes less space above the fans, than prior art fan air valves.

SUMMARY OF THE INVENTION

The present invention pertains to a valve for a vent. The valve comprises an inner leaf having a closed state which covers the vent and blocks gas flow through the vent in a first direction, and an open state which opens the vent and allows gas flow through the vent in a second direction. The valve comprises an outer leaf opposing the inner leaf.

The present invention pertains to a method for controlling gas flow through a vent. The method comprises the steps of moving an inner leaf and an outer leaf opposing the inner leaf on the vent from a closed state which covers the vent and blocks gas flow through the vent in a first direction to an open state which opens the vent and allows gas flow through the vent in a second direction with gas flow moving in the second direction through the vent. Then there is the step of stopping the gas flow in the second direction allowing the inner leaf and the outer leaf to each move to the closed state.

BRIEF DESCRIPTION OF THE DRAWINGS

In the accompanying drawings, the preferred embodiment of the invention and preferred methods of practicing the invention are illustrated in which.

DETAILED DESCRIPTION

Figure 1:
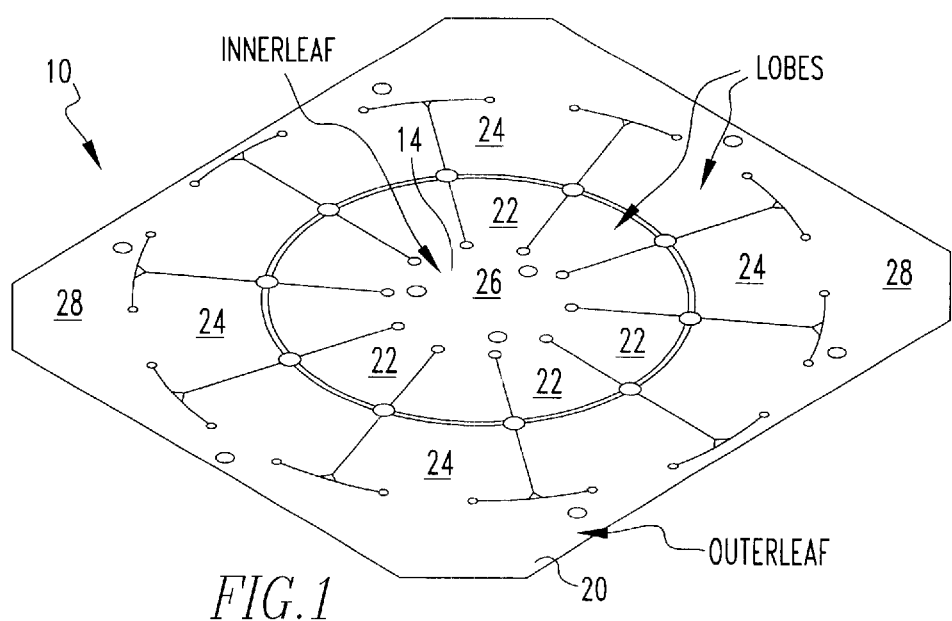
FIG. 1 is a schematic representation of a valve of the present invention.

Referring now to the drawings wherein like reference numerals refer to similar or identical parts throughout the several views, and more specifically to FIG. 1 thereof, there is shown a valve 10 for a vent 12. The valve 10 comprises an inner leaf 14 having a closed state which covers the vent 12 and blocks gas flow through the vent 12 in a first direction 16, and an open state which opens the vent 12 and allows gas flow through the vent 12 in a second direction 18. The valve 10 comprises an outer leaf 20 opposing the inner leaf 14.

Preferably, when the inner leaf 14 and the outer leaf 20 are in the open state, a 100% open area for gas flow in the second direction 18 is created. The inner leaf 14 preferably includes inner lobes 22 that align with the gas flow in the second direction 18 when the inner leaf 14 is in the open state. The outer leaf 20 preferably includes outer lobes 24 that align with the gas flow in the second direction 18 when the outer leaf 20 is in the open state.

Preferably, inner lobes 22 oppose associated outer lobes 24 and move away from each other when the inner leaf 14 and the outer leaf 20 go from the closed state to the open state. The inner leaf 14 preferably has an inner portion 26 that fixes to the vent 12. Preferably, the outer leaf 20 has an outer portion 28 that fixes to the vent 12.

The inner lobes 22 preferably extend outward from the inner portion 26. Preferably, the outer lobes 24 extend inward from the outer portion 28.

The inner leaf 14 is preferably made from a first sheet of thin flexible material, the outer leaf 20 is made from a second sheet of thin flexible material, both sheets of which are centric to each other and are cut into a specific pattern. Preferably, the valve 10 includes inner bolts 30 which secure the inner portion 26 to the vent 12; and including outer bolts 32 which secure the outer portion 28 to the vent 12.

The present invention pertains to a method for controlling gas flow through a vent 12. The method comprises the steps of moving an inner leaf 14 and an outer leaf 20 opposing the inner leaf 14 on the vent 12 from a closed state which covers the vent 12 and blocks gas flow through the vent 12 in a first direction 16 to an open state which opens the vent 12 and allows gas flow through the vent 12 in a second direction 18 with gas flow moving in the second direction 18 through the vent 12. Then there is the step of stopping the gas flow in the second direction 18 allowing the inner leaf 14 and the outer leaf 20 to each move to the closed state.

Preferably, the moving step includes the step of moving the inner and outer leafs to create a 100% open area. The moving step preferably includes the step of moving inner lobes 22 of the inner leaf 14 into alignment with the gas flow in the second direction 18 when the inner leaf 14 is in the open state and outer lobes 24 of the outer leaf 20 in the second direction 18 when the outer leaf 20 is in the open state. Preferably, the moving step includes the step of moving the inner lobes 22 and outer lobes 24 associated with the inner lobes 22 away from each other when the inner leaf 14 and the outer leaf 20 go from the closed state to the open state.

In the operation of the invention, the function of the fan air valve 10 is to permit the flow of air in one direction while preventing air from reflowing in the opposite direction in a vented enclosure. It consists of the two leaves made from two sheets of centric, thin, flexible materials cut into a specific pattern (see FIG. 1). Figure guards that could be a stiff grill or perforated material support the two leaves which are attached to them (see FIG. 1), with the exception of the lobes.

When placing the air valve 10 in a positive air stream, moving air forces the flexible lobes to open in the desired airflow direction. The lobes surfaces become aligned with the airflow direction, creating a 100% open area for the air to pass through. Thus, the air valve 10 allows airflow through with very little resistance.

When the airflow direction is reversed (such as during fan failure), the flexible lobs are pressed against the finger guides, no opening is created and the airflow is blocked.

Figure 2:
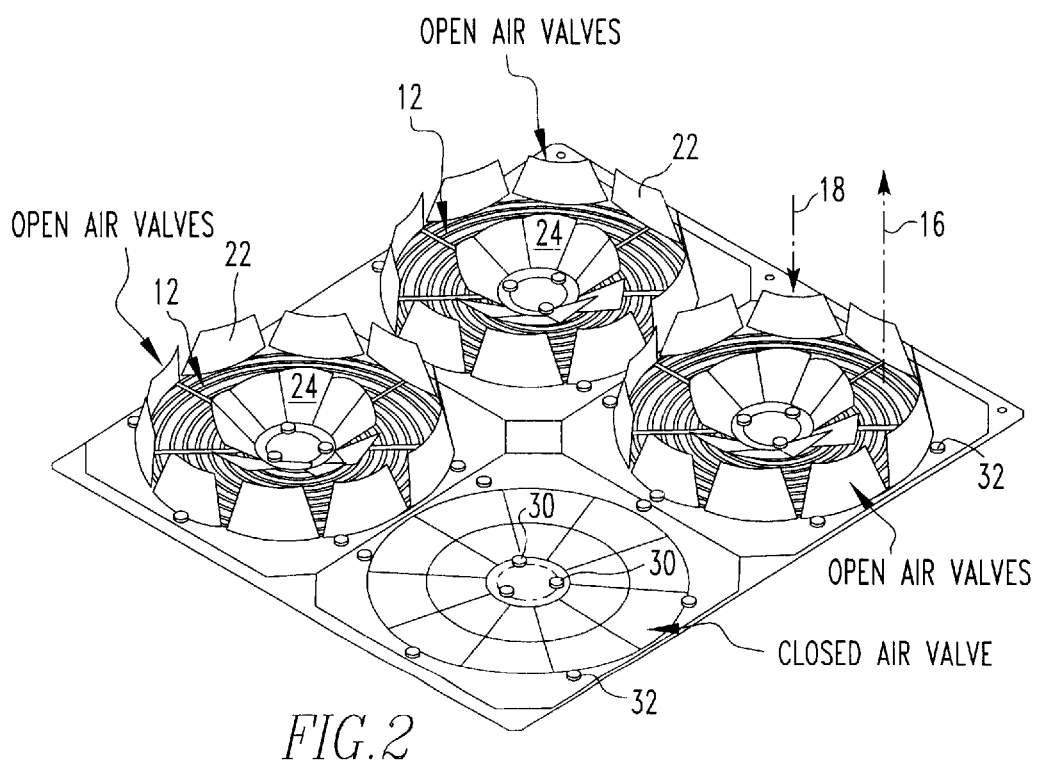
FIG. 2 is a schematic representation of valves in an open state of one valve in a closed state.

The performance of the fan air valve 10 is illustrated in FIG. 2 where one of the fans is not working. For the failed fan, its air valve 10 leaves are completely closed, while the remaining fans are working with their air valve 10 leaves open.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A valve for a vent comprising:
    an inner leaf having a closed state which covers the vent and blocks gas flow through the vent in a first direction, and an open state which opens the vent and allows gas flow through the vent in a second direction; and
    an outer leaf having an open state and a closed state, the outer leaf in alignment with the inner leaf and defining a plane when they are in the closed state.

2. A valve as described in claim 1 wherein when the inner leaf and the outer leaf are in the open state, a 100% open area for gas flow in the second direction is created.

3. A valve as described in claim 2 wherein the inner leaf includes inner lobes that align with the gas flow in the second direction when the inner leaf is in the open state; and the outer leaf includes outer lobes that align with the gas flow in the second direction when the outer leaf is in the open state.

4. A valve as described in claim 3 wherein inner lobes oppose associated outer lobes and move away from each other when the inner leaf and the outer leaf go from the closed state to the open state.

5. A valve as described in claim 4 wherein the inner leaf has an inner portion that fixes to the vent.

6. A valve as described in claim 5 wherein the outer leaf has an outer portion that fixes to the vent.

7. A valve as described in claim 6 wherein the inner lobes extend outward from the inner portion.

8. A valve as described in claim 7 wherein the outer lobes extend inward from the outer portion.

9. A valve as described in claim 8 wherein the inner leaf is made from a first sheet of thin flexible material, the outer leaf is made from a second sheet of thin flexible material, both sheets of which are centric to each other and are cut into a specific pattern.

10. A valve as described in claim 9 including inner bolts which secure the inner portion to the vent; and including outer bolts which secure the outer portion to the vent.

11. A method for controlling gas flow through a vent comprising the steps of:
    moving an inner leaf and an outer leaf in alignment with the inner leaf on the vent from a closed state which covers the vent and blocks gas flow through the vent in a first direction to an open state which opens the vent and allows gas flow through the vent in a second direction with gas flow moving in the second direction through the vent, the inner leaf and the outer leaf defining a plane when they are in the closed state; and
    stopping the gas flow in the second direction allowing the inner leaf and the outer leaf to each move to the closed state.

12. A method as described in claim 11 wherein the moving step includes the step of moving the inner and outer leafs to create a 100% open area.

13. A method as described in claim 12 wherein the moving step includes the step of moving inner lobes of the inner leaf into alignment with the gas flow in the second direction when the inner leaf is in the open state and outer lobes of the outer leaf in the second direction when the outer leaf is in the open state.

14. A method as described in claim 13 wherein the moving step includes the step of moving the inner lobes and outer lobes associated with the inner lobes away from each other when the inner leaf and the outer leaf go from the closed state to the open state.

15. A valve for a vent comprising:
    an inner leaf having a closed state which covers the vent and blocks gas flow through the vent in a first direction, and an open state which opens the vent and allows gas flow through the vent in a second direction, the inner leaf includes inner lobes that align with the gas flow in the second direction when the inner leaf is in the open state; and
    an outer leaf having a closed state and an open state, the outer leaf opposing the inner leaf, the outer leaf includes outer lobes that align with the gas flow in the second direction when the outer leaf is in the open state, the inner lobes oppose associated outer lobes and move away from each other when the inner leaf and the outer leaf go from the closed state to the open state.

16. A valve as described in claim 15 wherein when the inner leaf and the outer leaf are in the open state, a 100% open area for gas flow in the second direction is created.

17. A valve as described in claim 16 wherein the inner leaf has an inner portion that fixes to the vent.

18. A valve as described in claim 17 wherein the outer leaf has an outer portion that fixes to the vent.

19. A valve as described in claim 18 wherein the inner lobes extend outward from the inner portion.

20. A method for controlling gas flow through a vent comprising the steps of:
    moving inner lobes of an inner leaf and outer lobes of an outer leaf opposing the inner leaf on the vent from a closed state which covers the vent and blocks gas flow through the vent in a first direction to an open state which opens the vent and allows gas flow through the vent in a second direction with gas flow moving in the second direction through the vent by moving the inner lobes and outer lobes associated with the inner lobes away from each other when the inner leaf and the outer leaf go from the closed state to the open state; and
    stopping the gas flow in the second direction allowing the inner leaf and the outer leaf to each move to the closed state.

* * * * *

UNITED STATES PATENT AND TRADEMARK OFFICE
CERTIFICATE OF CORRECTION

PATENT NO.    : 6,554,698 B2
DATED         : April 29, 2003
INVENTOR(S)   : Sorin Kranzdorf and Lan Tang It is certified that error appears in the above-identified patent and that said Letters Patent is hereby corrected as shown below:

<u>Title page,</u>
Item [74], *Attorney, Agent or Firm*, replace "Angel M. Schwartz" with -- Ansel M. Schwartz --.

<u>Column 3,</u>
Line 10, replace "open state and" with -- open state which opens the vent and allows gas flow through the vent in the second direction and --.
Line 10, replace "closed state, the" with -- closed state which covers the vent and blocks gas flow through the vent in the first direction, the --.
Line 44, replace "inner leaf and" with -- inner leaf on the vent and --.
Line 44, replace "outer leaf in" with -- outer leaf on the vent in --.

<u>Column 4,</u>
Line 23, replace "outer leaf opposing the" with -- outer leaf in alignment with the --.
Line 26, replace "the inner lobes oppose associated" with -- the inner lobes in alignment with associated --.
Line 41, replace "outer leaf opposing the inner leaf" with -- outer leaf in alignment with the inner leaf --.

Signed and Sealed this

Fourth Day of May, 2004

JON W. DUDAS
*Acting Director of the United States Patent and Trademark Office*